(12) United States Patent
Kellermann

(10) Patent No.: US 8,310,838 B2
(45) Date of Patent: Nov. 13, 2012

(54) ELECTRIC DRIVE WITH A CIRCUIT BOARD

(75) Inventor: Helmut Kellermann, Langenzenn (DE)

(73) Assignee: Bühler Motor GmbH, Nürnberg (DE)

( * ) Notice: Subject to any disclaimer, the term of this patent is extended or adjusted under 35 U.S.C. 154(b) by 164 days.

(21) Appl. No.: 12/591,037

(22) Filed: Nov. 5, 2009

(65) Prior Publication Data

US 2010/0118503 A1    May 13, 2010

(30) Foreign Application Priority Data

Nov. 13, 2008 (DE) .......................... 10 2008 057 154

(51) Int. Cl.
*H01R 9/00* (2006.01)
(52) U.S. Cl. ......... 361/772; 361/773; 361/774; 174/266
(58) Field of Classification Search .......... 257/789–790; 361/772, 773–774; 310/88
See application file for complete search history.

(56) References Cited

U.S. PATENT DOCUMENTS

| | | | |
|---|---|---|---|
| 4,107,836 A * | 8/1978 | Roberts | 29/847 |
| 4,216,576 A | 8/1980 | Ammon et al. | |
| 4,230,385 A | 10/1980 | Ammon et al. | |
| 5,863,597 A * | 1/1999 | Lynch | 174/254 |
| 5,925,948 A | 7/1999 | Matsumoto | |
| 6,127,038 A | 10/2000 | McCullough et al. | |
| 2001/0051098 A1 * | 12/2001 | Kenney et al. | 417/410.1 |
| 2003/0141096 A1 * | 7/2003 | Saccomanno | 174/100 |
| 2006/0192448 A1 * | 8/2006 | Hill | 310/88 |

FOREIGN PATENT DOCUMENTS

DE    3936843 A1    5/1990

* cited by examiner

*Primary Examiner* — Tuan T Dinh
*Assistant Examiner* — Steven Sawyer
(74) *Attorney, Agent, or Firm* — Jacobson Holman PLLC

(57) ABSTRACT

An electric drive (1) with a circuit board (2), having conductor tracks (3) and contact openings (4) with plated through-holes (5) and equipped with electronic components (6), the circuit board (2) being coated with a protective layer (7) of insulating material, and press-fit contacts (8) are inserted into the contact openings (4) and in electrical contact areas (9) within the contact openings (4) electrical contact exists between a press-fit contact (8) and the plated through-hole (5) of the contact opening (4). The task of the invention is to reliably protect circuit boards of electric drives exposed to moisture and other chemical environmental effects and contact them economically. This task is solved according to the invention in that the protective layer (7) is a parylene coating, which covers the circuit board (2), the electronic components (6) and the surface areas of the contact openings (4) and circuit board (2) directly connected to the contact areas (9) between at least one press-fit contact (8) and at least one contact opening (4).

6 Claims, 2 Drawing Sheets

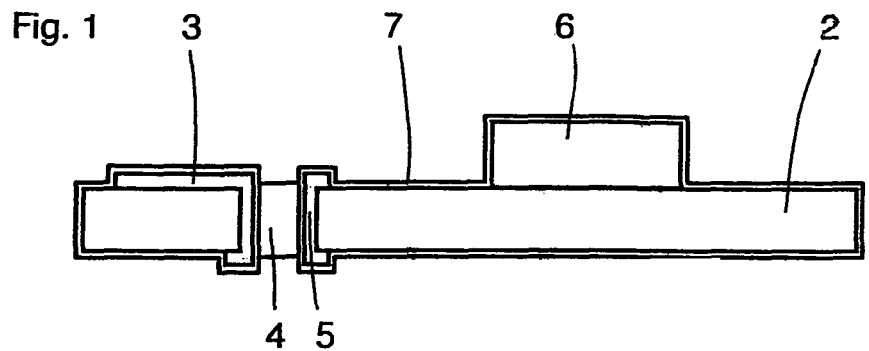
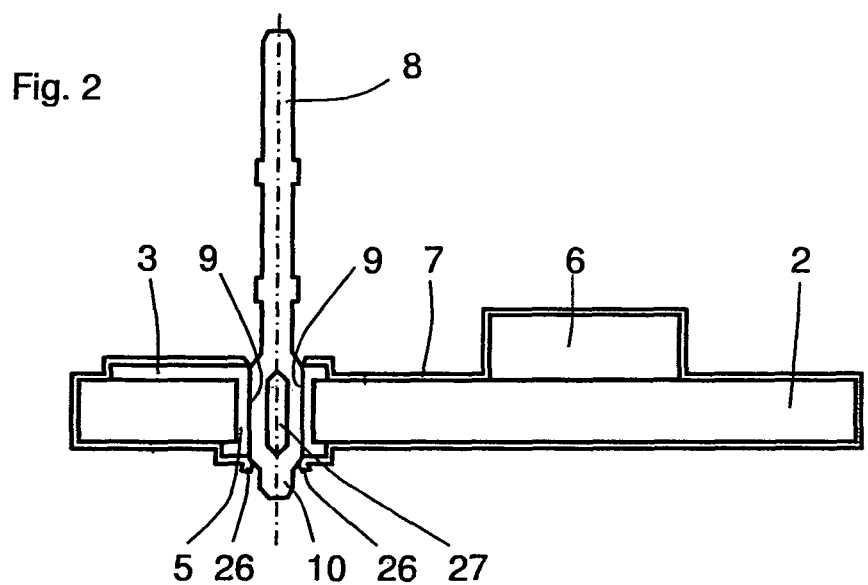
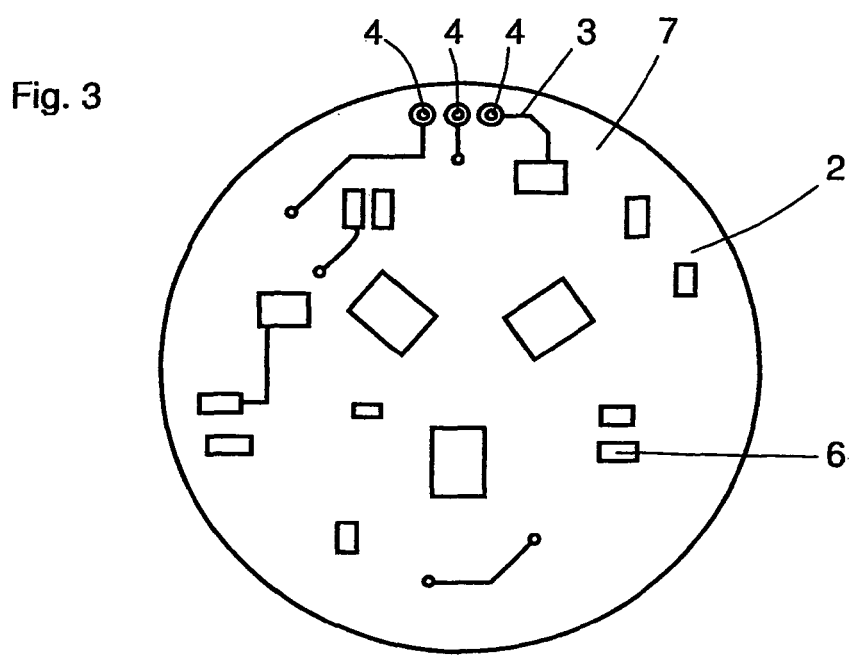

ELECTRIC DRIVE WITH A CIRCUIT BOARD

BACKGROUND OF THE INVENTION (1) Field of the Invention

The invention concerns an electric drive (1) with a circuit board (2), having conductor tracks (3) and contact openings (4) with plated through-holes (5) and equipped with electronic components (6). The circuit board (2) is coated with a protective layer (7) of insulating material, and press-fit contacts (8) are inserted into the contact openings (4) and in the electrical contact areas (9) within the contact openings (4), electrical contact exists between the press-fit contact (8) and the plated through-hole (5) of the contact opening (4).

(2) Description of Related Art Including Information Disclosed Under 37 CFR 1.97 and 1.98

Protection of circuit boards by parylene coating has proven itself to be a hydrophobic, chemically-resistant barrier relative to inorganic and organic media, strong acids, alkalis, gases and water vapor. Parylene is an excellent electrical insulator with high voltage strength and low dielectric constant. The protective coating is applied to the substrate as a pore-free and transparent polymer film in vacuum by condensation from a gas phase (CVD process/chemical vapor deposition). The process has the result that the polymer coating fully encloses the circuit board, so that subsequent electrical conduction thus far only appeared to be possible after additional machining steps. According to the prior art, electrical connection sites have thus far been protected by applying a masking material before the CVD process. As an alternative, the parylene coating can be partially ablated with a laser beam, or can also be removed mechanically. These additional construction steps increase manufacturing costs and manufacturing risks.

Press-fit electrical contacting has established itself as an economical contacting possibility for uncoated circuit boards. Commercial press-fit electrically conductive contacts are then inserted into the contact openings by a simple insertion process and, in so doing, form a permanent reliable contact and an electrical connection without additional soldering or welding processes.

BRIEF SUMMARY OF THE INVENTION

An object of the invention is to reliably protect circuit boards of electric drives that are exposed to moisture and other chemical environmental effects and to contact them economically.

This object is attained according to the invention by providing an electric drive with a circuit board, having conductor tracks and contact openings with plated through-holes and equipped with electronic components. The circuit board is coated with a protective layer of insulating material. Press-fit contacts are inserted into the contact openings. In electrical contact areas within the contact openings, electrical contact exists between a press-fit contact and plated through-hole of the contact opening. The protective layer is a parylene coating, which covers the circuit board, the electronic components and the surface areas of the contact openings and the circuit board is connected directly to the contact areas between at least one press-fit contact and at least one contact opening. The invention also covers the method of making the inventive electric drive.

Parylene protects the circuit board by a very thin layer that has virtually no adverse effect on the mechanical properties and dimensions of the circuit board. Layer thicknesses from 0.1 to 50 μm can be applied in one working step. Since the material is converted directly from the gas phase to the solid phase, no meniscus formation occurs on sharp edges, tips, narrow and deep gaps or on electrical components. Since the circuit board is coated over its full extent, the distances between the components and the conductor tracks can be chosen narrower than in uncoated circuit boards, and this is especially true for the areas in which the circuit board is contacted. Maskings or finishing operations would result in unprotected areas on the circuit board between the contacts, so that the reliability is restricted and the hazard of dendrite formation would be present. Dendrites develop through electrochemical processes and, on continuing dendrite growth, lead to short-circuits. Through the solution according to the invention, only the areas of the circuit board that serve directly as electrical contact areas and are covered by the press-fit contacts are actually unprotected.

Modifications of the invention are contemplated. For example, the protective layer of the electric drive is separated in the contact area by a press-fit contact area. Also, the protective layer, which may be a Parylene D coating, is at least partially displaced from the contact area by the press-fit contact. In the electric drive, the press-fit contacts do not contain any Parylene coating. The circuit board is a component of a brushless DC motor which is a component of a rotary pump drive. Finally, Parylene D (for example, polyparadichloroxylylene) has turned out to be particularly suitable for the coating.

BRIEF DESCRIPTION OF THE SEVERAL VIEWS OF THE DRAWINGS

Practical examples of the invention are explained further below by means of the drawing. In the drawing:

FIG. 1 shows a sectional view of an equipped and coated circuit board,

FIG. 2 shows the circuit board with mounted press-fit contact,

FIG. 3 shows a top view of the circuit board and

DETAILED DESCRIPTION OF THE INVENTION

Figure 4:
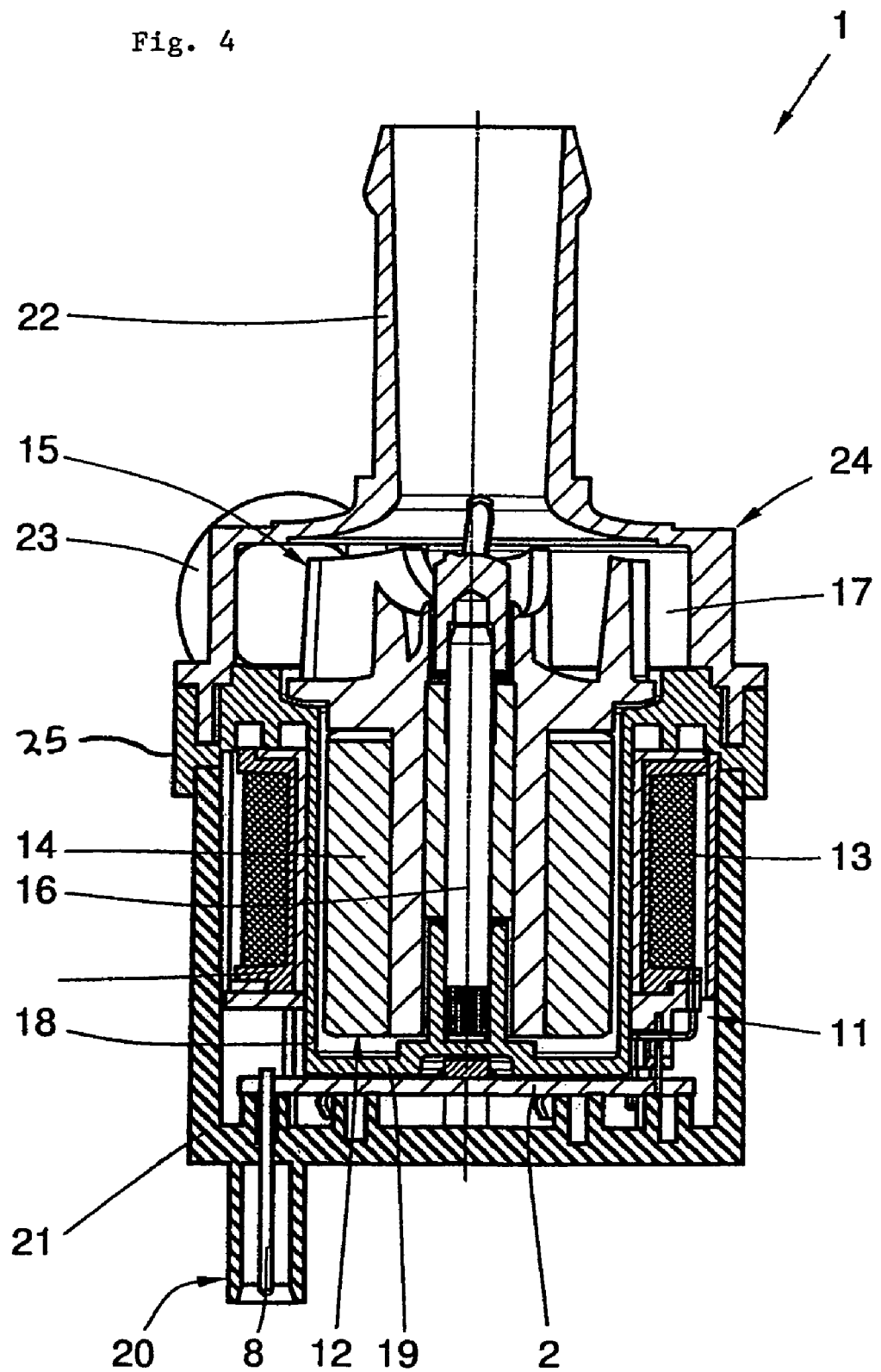
FIG. 4 shows a sectional view through an electrical board with a circuit board.

In describing preferred embodiments of the present invention illustrated in the drawings, specific terminology is employed for the sake of clarity. However, the invention is not intended to be limited to the specific terminology so selected, and it is to be understood that each specific element includes all technical equivalents that operate in a similar manner to accomplish a similar purpose.

FIG. 1 shows a sectional view of a circuit board 2 equipped with an electrical component 6 coated with a protective layer 7 of parylene material. The coating also includes an contact opening 5 with plated through-hole 4, as well as electrical conductor tracks 3. The electronic components are mostly SMD (Surface Mounted Device) components. In the depicted stylized example, the entire circuit board 2 is coated without gaps with parylene coating. The invention also includes circuit boards that are not coated on defined areas for other reasons.

FIG. 2 shows the circuit board 2 with a mounted press-fit electrically-conductive contact 8. The press-fit contact 8 has a joining aid on its end, whose diameter is less than the diameter in the contact area 9. The press-fit contact 8 is dimensioned in the part that mates with the contact area 9, so that a mechanical press-fit connection would also be present without a coating on the circuit board. The press-fit contact 8 is formed in such a way in the contact area 9, so that the parylene coating at this site is separated and therefore a reliable electrical connection is guaranteed between the press-fit contact 8 and the plated through-hole 5. The coating is partially displaced from the contact area. In FIG. 2, the displaced coating 26 is readily apparent. In the depicted example, the coating is a parylene D material, having greater brittleness than, say, parylene C. Because of the greater brittleness, separation of the contact area is more easily accomplished. This situation of the parylene coating is achieved with commercial press-fit contacts. These are generally stamped parts that are angular. The parylene coating can also be displaced from the contact area with fewer sharp-edged press-fit contacts. The press-fit contact 8 in the section of the contact areas 9 has a free space 27 that permits limited backing away and contraction of the press-fit contact 8 during joining.

FIG. 3 shows a top view of a circuit board 2 provided with a protective layer coating 7 with electrical components 6, conductor tracks 3 and contact openings 4. The circuit board 2 is shown in FIGS. 1 to 3 as a circuit board equipped with components on one side. However, the invention also includes circuit boards that are equipped on both sides and are provided with conductor tracks, and also multilayer circuit boards.

FIG. 4 shows a sectional view through an electric drive with a circuit board 2. The electric drive here is a rotary pump driven by an electronically commutated DC motor with a stator 11 and a rotor 12. The stator 11 includes an electrical winding 13 and the rotor 12 a permanent magnet 14. The rotor is mounted to rotate on a shaft 16 in one piece with a pump impeller 15.

The rotor 12 is situated in a wet area or space 17 of the rotary pump. The wet area 17 is separated by a slit casing 18 from the stator 11 and the circuit board 2. The circuit board 2 is electrically connected to winding 13 and contacts and lies over a large surface on a casing bottom 19 of the slit casing 18 in a heat-conducting path. The thin parylene coating here also has the advantage that it only very slightly compromises heat conduction to the wet space because of the coatings low heat resistance. The circuit board 2 is provided with a press-fit contact 8, which is part of a connection plug 20. The connection plug 20 is in one piece with a motor housing 21. The rotary pump includes a suction connector 22 and a pressure connector 23. The suction connector 22 and the pressure connector 23 are in one piece with a pump head 24. The slit casing 18 is provided on the pump side with a flange 25 that expands radially outward, which is arranged sandwich-like between the pump head 24 and motor housing 21 and welded to its connection areas. The press-fit contacts 8 are only inserted with the connection plug 20 after mounting of the circuit board 2 and the motor housing 21.

Modifications and variations of the above-described embodiments of the present invention are possible, as appreciated by those skilled in the art in light of the above teachings. It is therefore to be understood that, within the scope of the appended claims and their equivalents, the invention may be practiced otherwise than as described and illustrated.

List Of Reference Numbers
1 Electric drive
2 Circuit board
3 Conductor track
4 Contact opening
5 Plated through-hole
6 Electronic component
7 Protective layer
8 Press-fit contact
9 Contact area
10 Joining aid
11 Stator
12 Rotor
13 Winding
14 Permanent magnet
15 Pump impeller
16 Shaft
17 Wet space
18 Slit casing
19 Casing bottom
20 Connection plug
21 Motor housing
22 Suction connector
23 Pressure connector
24 Pump head
25 Flange
26 Displaced coating
27 Free space

What is claimed is:

1. An electric drive comprising:
a motor housing having a casing bottom with a surface;
an electric motor with a stator and a rotor with the stator including an electrical winding;
a circuit board having a mounting surface, the circuit board lying over a portion of the surface of the casing bottom in a heat-conducting path;
means for electrically connecting the winding of the stator to the circuit board; a plurality of conductor tracks formed on the mounting surface;
a plurality of contact openings with plated through-holes formed in the circuit board, each through-hole having a contact surface area of a first predetermined diameter; at least one electronic component mounted on the mounting surface; a protective layer of insulating material formed from parylene coating the mounting surface, the conductor tracks, the contact surface areas of the plated through- holes, and the electronic component; and press-fit contacts, each contact of a second predetermined diameter sufficient to separate and displace the parylene to expose the contact surface area of a through-hole, each press-fit contact being inserted in a mating through-hole whereby the insertion of each press-fit contact separates and displaces the parylene to expose the surface area of a mating through-hole thus creating a mechanical press-fit connection which provides an electrical contact between a press-fit contact and plated through-hole of the contact opening, the first and second diameters dimensioned such that the mechanical press-fit contact is formed even without the protective layer on the contact openings.

2. The electric drive according to claim 1, wherein the protective layer is at least partially displaced from the contact area by the press-fit contact.

3. The electric drive according to claim 1, wherein the protective layer is a parylene D coating.

4. The electric drive according to claim 1, wherein the press-fit contacts are free of any parylene coating.

5. The electric drive according to claim 1, wherein the electric motor is a brushless DC motor and the brushless DC motor is a component of a pump drive.

6. The electric drive according to claim 5, wherein the pump drive is a rotary pump drive.

* * * * *